(12) United States Patent
Castagna et al.

(10) Patent No.: US 7,408,377 B2
(45) Date of Patent: Aug. 5, 2008

(54) DRIVING CIRCUIT OF AN OUTPUT BUFFER STAGE HAVING A HIGH SPEED AND A REDUCED NOISE INDUCED ON POWER SUPPLY

(75) Inventors: Giuseppe Castagna, Palermo (IT);
Salvatore Imbesi, Palermo (IT);
Salvatore Mazzara, Palermo (IT);
Salvatore Polizzi, Palermo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 82 days.

(21) Appl. No.: 11/256,245

(22) Filed: Oct. 21, 2005

(65) Prior Publication Data

US 2006/0091910 A1      May 4, 2006

(30) Foreign Application Priority Data

Oct. 29, 2004   (IT) .......................... MI2004A2075

(51) Int. Cl.
*H03K 17/16* (2006.01)
*H03K 19/003* (2006.01)
(52) U.S. Cl. .............................. 326/27; 326/26; 326/87
(58) Field of Classification Search ............. 326/26–27, 326/30, 87; 327/108–112
See application file for complete search history.

(56) References Cited

U.S. PATENT DOCUMENTS

| | | | | |
|---|---|---|---|---|
| 5,389,834 A | * | 2/1995 | Kinugasa et al. | 326/21 |
| 5,430,387 A | * | 7/1995 | Bechade et al. | 326/27 |
| 5,804,990 A | * | 9/1998 | Popat et al. | 326/114 |
| 5,926,651 A | * | 7/1999 | Johnston et al. | 710/52 |
| 6,653,873 B1 | * | 11/2003 | Nguyen | 327/112 |
| 6,720,794 B2 | * | 4/2004 | Seike | 326/27 |
| 7,053,679 B2 | * | 5/2006 | Rho | 327/108 |

* cited by examiner

*Primary Examiner*—Anh Q Tran
(74) *Attorney, Agent, or Firm*—Lisa K. Jorgenson; Allen, Dyer, Doppelt, Milbrath & Gilchrist, P.A.

(57) ABSTRACT

A driving circuit is for an output buffer stage, with high speed and reduced noise induced on the power supply. The driving circuit may include first and second circuit portions, each intended for the generation of a respective driving signal for a corresponding transistor of the buffer stage. Each portion may include a final stage with a complementary pair of MOS transistors inserted between two supply voltage references, and a third MOS transistor having its conduction terminals connected between one of the voltage references and an interconnection node of the complementary pair and receiving, on its control terminal, an activation pulse signal coming from a logic network incorporating at least one delay chain.

34 Claims, 11 Drawing Sheets

DRIVING CIRCUIT OF AN OUTPUT BUFFER STAGE HAVING A HIGH SPEED AND A REDUCED NOISE INDUCED ON POWER SUPPLY

FIELD OF THE INVENTION

The present invention relates to a driving circuit architecture for an output buffer stage with high speed and with reduced noise induced on the power supply. More particularly, the invention relates to a driving circuit as above and comprising first and second circuit portions, each one provided for the generation of a respective driving signal for a corresponding transistor of the buffer stage.

BACKGROUND OF THE INVENTION

As it is well known in the specific field of the manufacturing of semiconductor integrated memory devices, at present the market for nonvolatile memories typically requires higher and higher access speeds against lower and lower supply voltages. This need results from the desire of reducing the power consumption as much as possible and increasing, in the meantime, the so-called throughput.

Within this field the output buffer stages play a fundamental role. Their switching speed is strictly connected to the memory access time and the several switchings they are subjected to strongly affect the power consumption. For example, to optimize the power consumption in an output stage realized according to CMOS technology, the periods of time when the PMOS and NMOS transistors are simultaneously in the saturation zone may have to be reduced to the minimum. In fact, during the transitions between one logic level and another, there is typically a period when both the MOS transistors are in the saturation zone and generate a current between the power supply and ground, called the OVERLAP current.

By way of example, we now consider the case of a CMOS output stage which should drive a capacitive load Cload, as shown in FIG. 1. In this case it may be important to ensure that the charging occurs through the PMOS transistor with the other NMOS transistor in the cut-off state. Instead, the discharging step should occur through the NMOS transistor when the other PMOS transistor is cut-off. In this way during the charging and discharging steps of the capacitor Cload, there may never be an OVERLAP current.

However, to ensure that these conditions occur, the two control signals applied to the respective gate terminals of the NMOS and PMOS transistors should be split, as shown in FIG. 2. When the output has to pass from the high logic value to the low one, which corresponds to the discharging step of the capacitor, first the PMOS transistor should be cut-off and then the NMOS transistor should go into conduction. Instead, in the other transition, it's the NMOS transistor that should be cut-off before the PMOS transistor goes into conduction. The timing of the just described events is shown in FIG. 4.

From what has been said, it can be inferred that the generation of the two control signals is anything but simple, and it directly affects the buffer performance. It should be also highlighted that the rise speed of the two control signals and their pattern are directly connected to the disturbance induced on the power supply by the buffer switchings. To avoid too high noise peaks, the turn-on of the PMOS transistor and of the NMOS transistor is controlled so that the charge/discharge current of the capacitor Cload has a constant slope (dI/dt=const).

The noise induced on the power supply Vdd is substantially caused by the voltage variation across the parasitic inductor/resistor group, inevitably in the supply line. To better understand the phenomena previously described, reference can be made to FIG. 3 that shows a schematic block diagram comprising an output buffer and the main circuit blocks operating therewith.

FIGS. 5 and 6 respectively show in detail: the supply block, and an example of circuit for the generation of the driving controls of the buffer stage. The most commonly used approach for the generation of the control signals GATEP and GATEN is shown in the example of FIG. 6. This circuit ensures a constant dI/dt during the first charging and discharging steps of the capacitor Cload.

The limitation of sudden current variations on the capacitor results in the lack of spikes on the supply voltage. The variations of inductive nature on the power supply are proportional to the variation of the current absorbed by the supply source LdI/dt, whereas the variations of a resistive nature are proportional to the current required by the source.

What has been so far described allows generating a control signal with a constant slope. In the period of time elapsing between the start of the control signal and the overtaking of the threshold voltage of the MOS transistors of the output driver, it is possible to speed up the times, since the load driving step is still to come. A control is then attained, so called with two slopes, the first steeper between the instant zero and the overtaking of the threshold voltage of the MOS transistor (i.e. the PMOS transistor during the charging and the NMOS transistor during the discharging) and a second slope, less steep, until the output switchings are reached.

FIGS. 7 and 8 show the two control signals GATEN and GATEP and the respective circuit schematic diagrams for the generation of these control signals with two slopes. The first section, with the steeper slope, is obtained by a resistor R1, whereas the second, with a less steep slope, is obtained with the introduction of a resistor R2 and by switching of a signal CONTROL_1N or CONTROL_1P, according to the transistor being driven.

This approach however, has a drawback due to the fact that the resistors used for obtaining the two different slopes make sure that the voltage values on the gate terminals of the transistors of the buffer stage do not go to zero (in the case of the NMOS) or to Vdd (in the case of the PMOS) also when the variation has occurred. To address this problem the known technique proposes the scheme of FIGS. 9 and 10 that realize a control with three slopes.

With respect to the previous approach the presence can be appreciated of a MOS transistor which completely short-circuits the resistor once the transition has occurred. It is in fact to be remembered that after an initial period when the current across the capacitor would tend to vary in a sudden way, causing noise on the power supply, the current tends to zero in an exponential way, therefore the control is not necessary any more. The scheme of FIGS. 9 and 10 differs from that of FIGS. 7 and 8 with the introduction of the signals CONTROL_2N and CONTROL_2P. Such signals, obtained through a suitable delay by the signal CONTROL_1N or CONTROL_1P, allow driving the NMOS transistor that short-circuits both the resistor R1 and the resistor R2. The above delay is preferably obtained by a chain of inverters in cascade, being suitably sized and as seen in the figures.

Although advantageous under several aspects, this approach also exhibits a limitation. In the applications to multi-level memories there is the need of obtaining low output impedances from the buffers and the use of the latter approach described has revealed itself to be a problem since low output impedances result in the need of using resistors of too low a value that cannot be practically realized or which are too subject to variations due to the manufacturing process. Therefore the approach of generating control signals with the linear profile at intervals obtained by resistors has revealed itself to be difficult to be applied.

The problem addressed by the present invention is that of providing a driving circuit for an output buffer stage incorporated in a memory electronic device, having such structural and functional characteristics as to allow the generation of driving signals with a linear pattern at intervals, the signal being however generated by components of the MOS or CMOS type, thus overcoming the limits of the approaches proposed by the prior art.

SUMMARY OF THE INVENTION

In view of the foregoing background, it is therefore an object of the present invention to provide a driving circuit and associated methods for the efficient driving of the output buffer stage with reduced noise on the power supply.

This and other objects, features and advantages in accordance with the present invention are provided by a driving circuit comprising a first circuit portion for generating a driving signal for the NMOS transistor of the output buffer stage, and a second circuit portion for generating a driving signal for PMOS transistor of the output buffer stage. Moreover, each of the first and second circuit portions may comprise a complementary pair of MOS transistors coupled between supply voltage references, with the complementary pair of MOS transistors defining an interconnection node therebetween. Each circuit portion may also include a logic network to generate an activation signal, and a third MOS transistor having conduction terminals coupled between one of the voltage references and the interconnection node, and a control terminal responsive to the activation signal.

A method aspect is for driving an output buffer stage comprising a PMOS transistor and an NMOS transistor coupled together. The method may comprise generating a driving signal for the NMOS transistor of the output buffer stage using a first circuit portion, and generating a driving signal for PMOS transistor of the output buffer stage using a second circuit portion. The first and second circuit portions may be as described above.

BRIEF DESCRIPTION OF THE DRAWINGS

The characteristics and advantages of the driving circuit according to the invention will be apparent from the following description of an embodiment thereof given by way of indicative and nonlimiting example with reference to the annexed drawings.

DETAILED DESCRIPTION OF THE PREFERRED EMBODIMENTS

Figure 1:
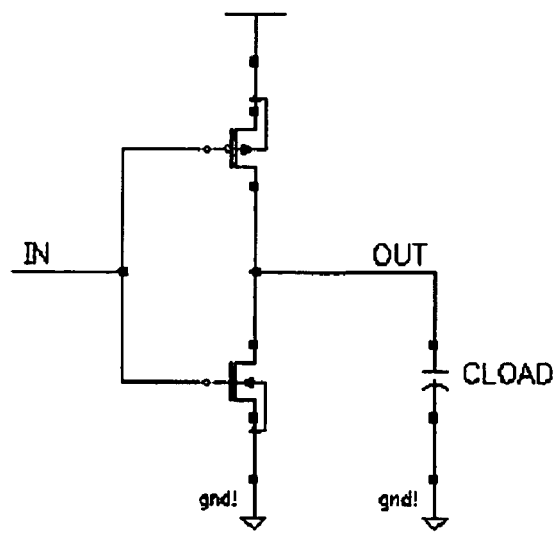
FIG. 1 shows a schematic view of an output buffer stage of the CMOS type for driving a capacitive load as in the prior art.
Figure 2:
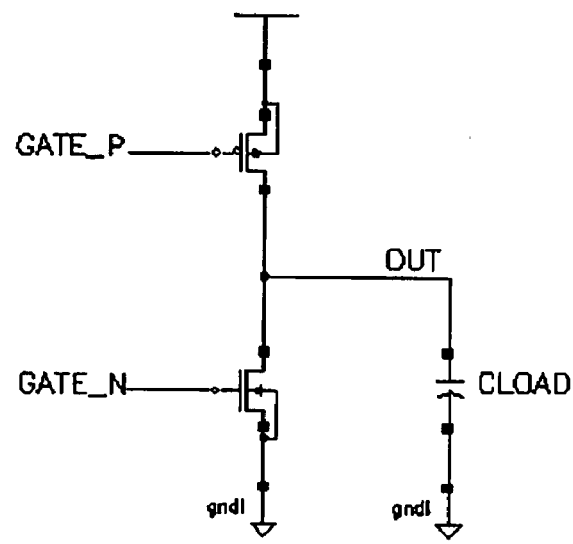
FIG. 2 shows a schematic view of the buffer stage of FIG. 1 where the respective control signals applied to the gate terminals of the NMOS and PMOS transistors of the stage are highlighted as in the prior art.
Figure 3:
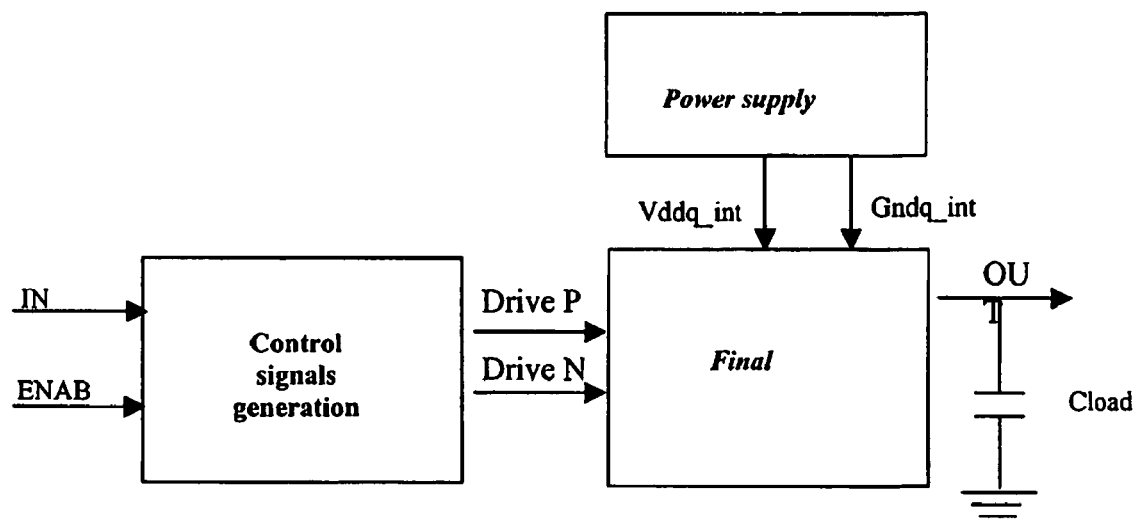
FIG. 3 shows a schematic block scheme of circuit portions provided for supplying and generating driving signals for a buffer stage, for example of the type shown in FIG. 2 as in the prior art.
Figure 4A:
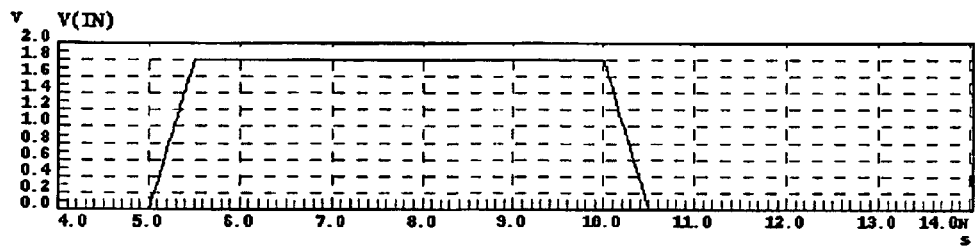
FIGS. 4A to 4E show respective diagrams having the same time base and relating to voltages and currents in the buffer stage of FIG. 2 as in the prior art.
Figure 4B:
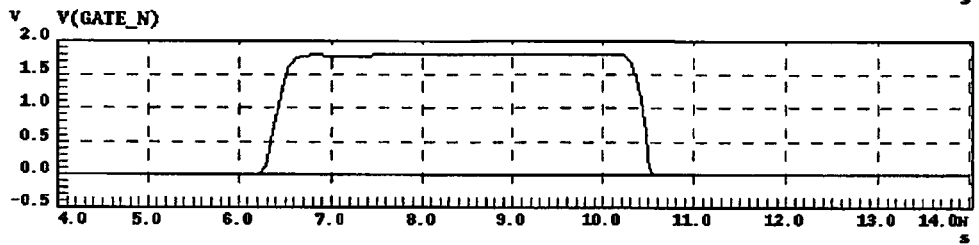
Figure 4C:
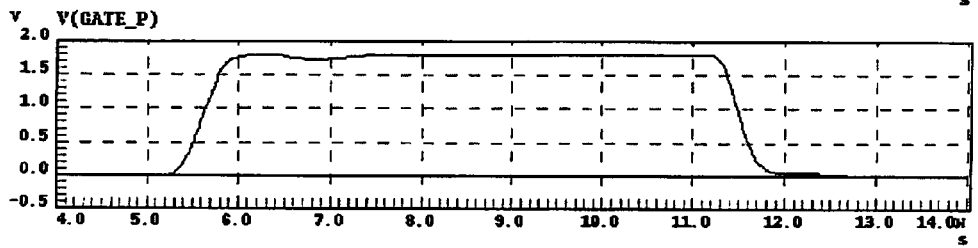
Figure 4D:
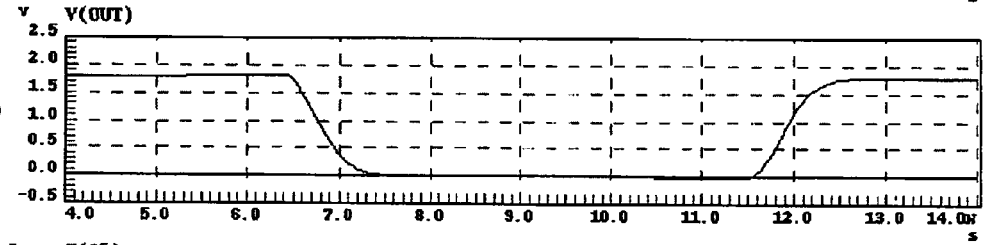
Figure 4E:
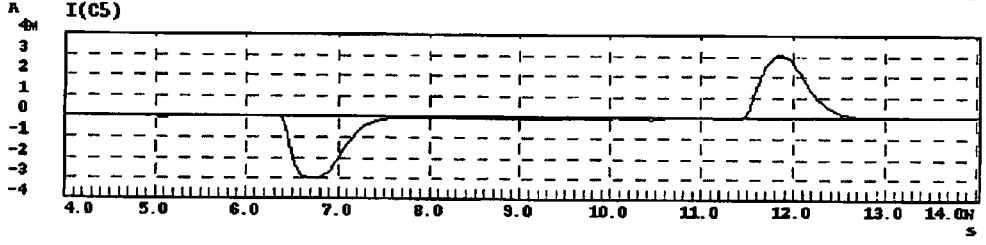
Figure 5:
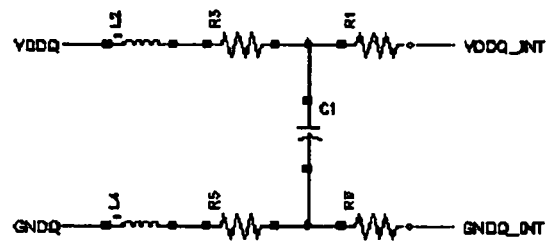
FIG. 5 shows a schematic view of a detail of a supply block of the scheme of FIG. 3 as in the prior art.
Figure 6:
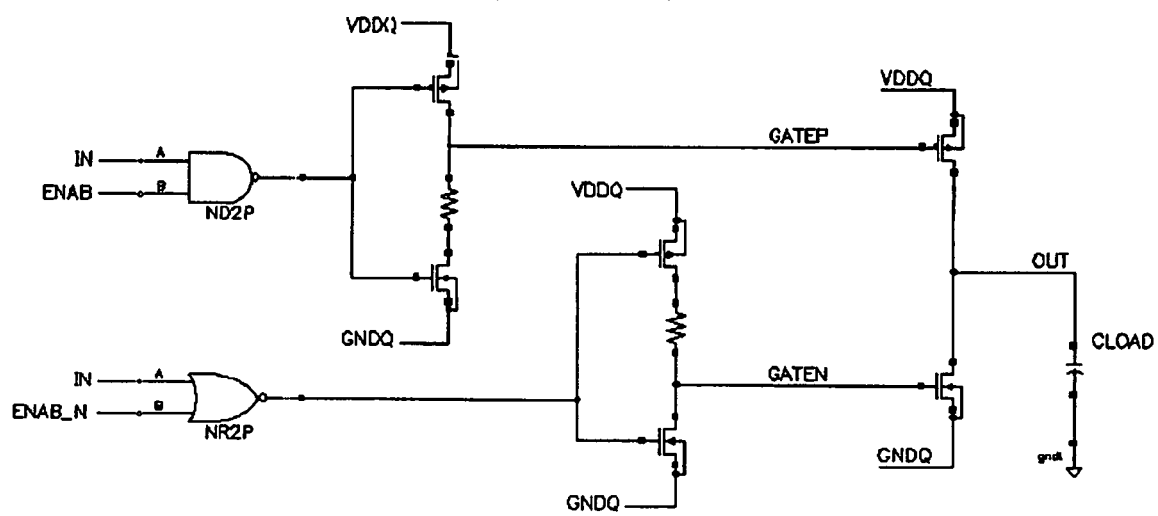
FIG. 6 shows a schematic view of a detail of a generation block of driving signals GATEN and GATEP of the scheme of FIG. 3 as in the prior art.
Figure 7:
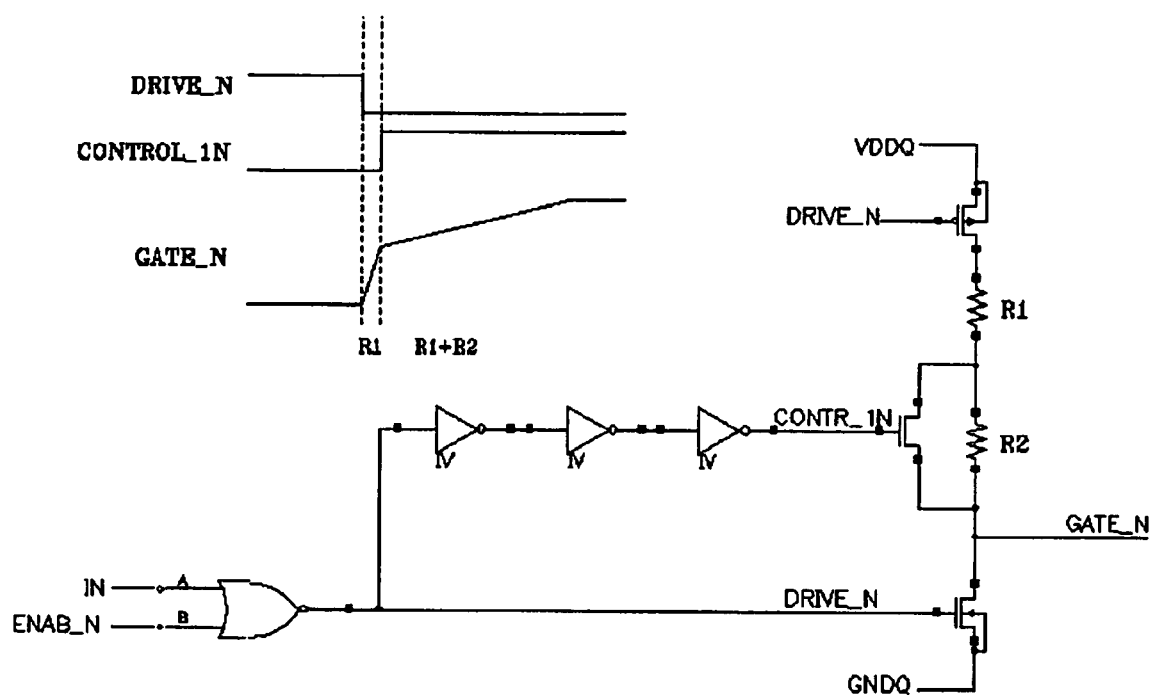
FIGS. 7 and 8 show respective schematic views of circuit portions of a driving circuit of the known type for an output buffer stage as in the prior art.
Figure 8:
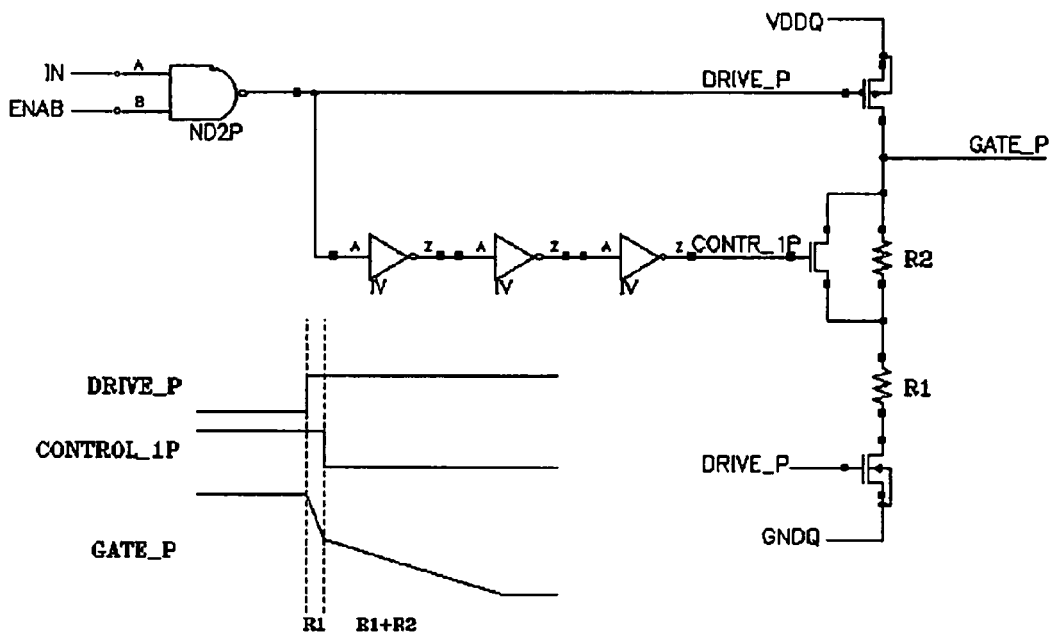
Figure 9:
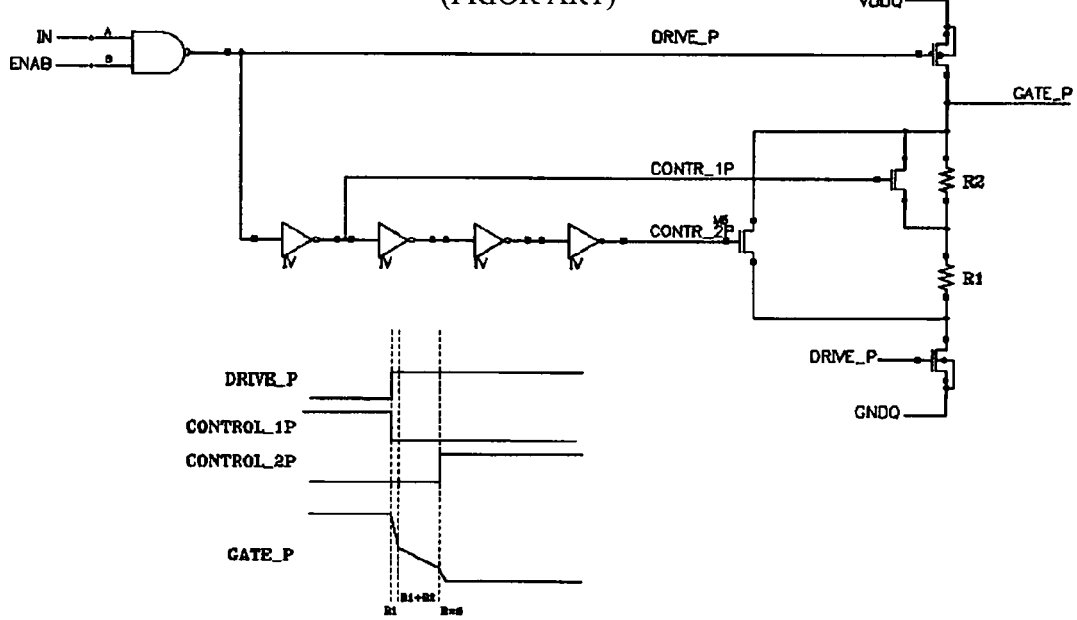
FIGS. 9 and 10 show respective schematic views of circuit portions of another known type of driving circuit for an output buffer stage as in the prior art.
Figure 10:
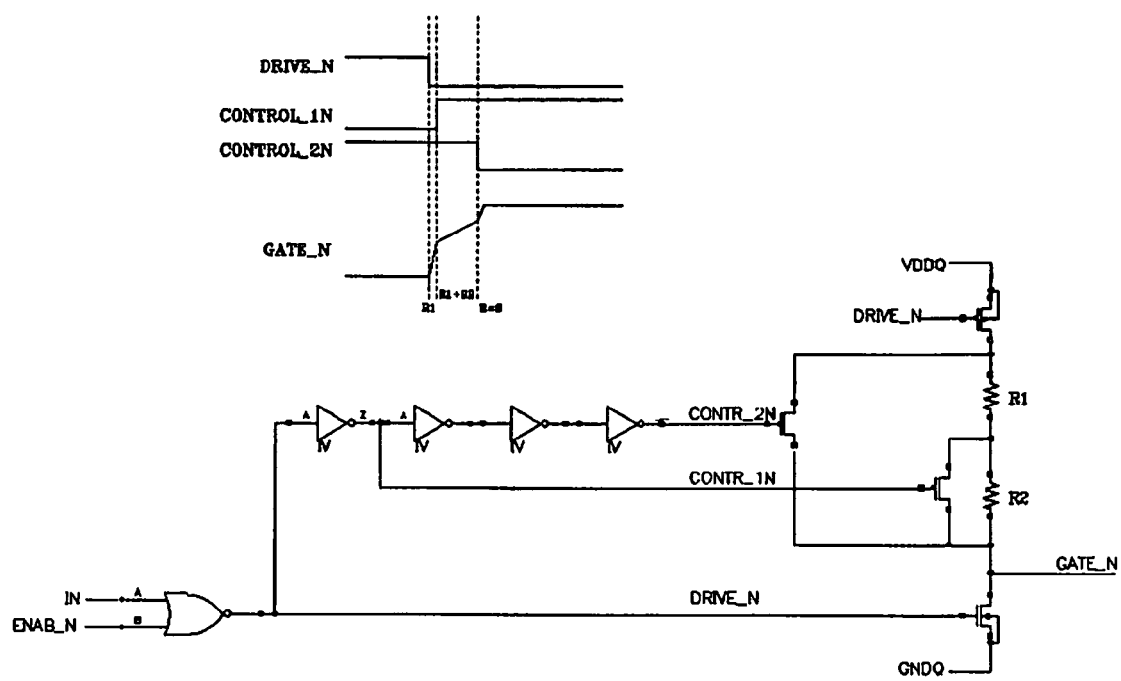
Figure 11:
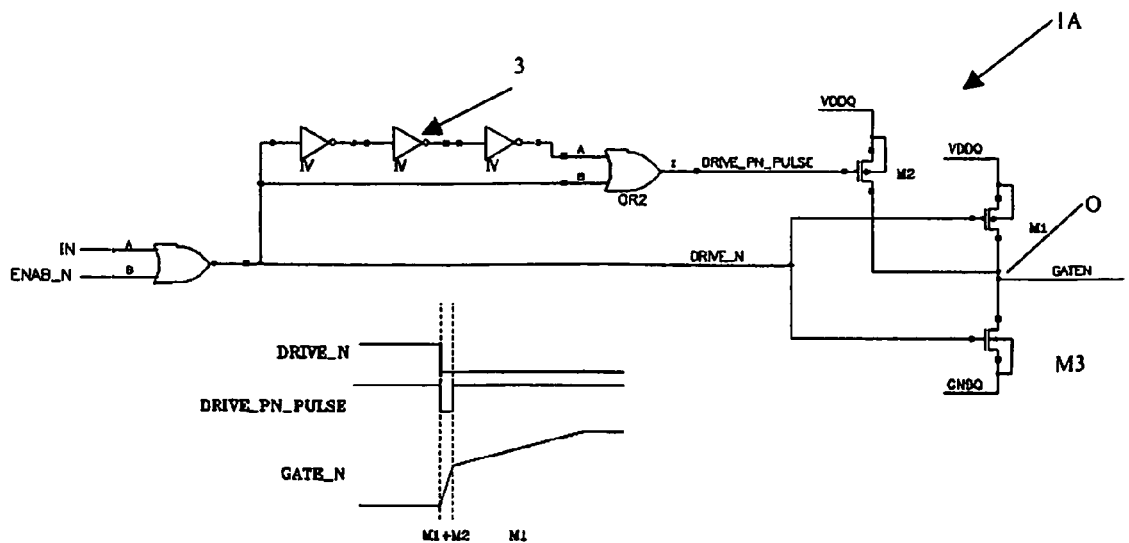
FIGS. 11 and 12 show respective schematic views of circuit portions of a driving circuit for an output buffer stage realized according to the present invention.
Figure 12:
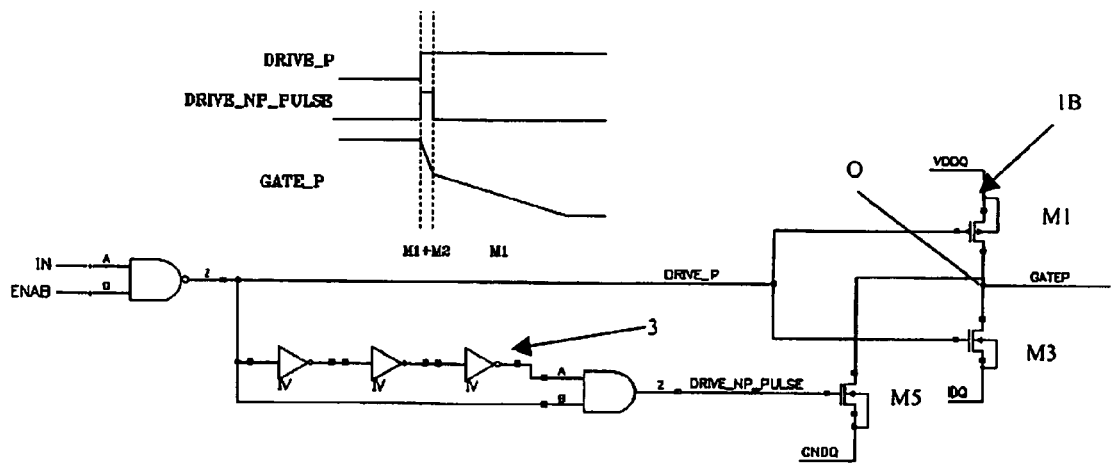

With reference to such figures, and in particular to the examples of FIGS. 11 and 12, reference numbers 1A and 1B globally and schematically indicate respective portions of a driving circuit realized according to the invention for an output buffer stage 2 preferably incorporated in semiconductor integrated nonvolatile memory electronic devices.

The circuit portions 1A and 1B are respectively provided for the generation of a driving signal to be applied to the gate terminal of a corresponding transistor of the buffer stage. More particularly, the portion 1A of FIG. 11 is intended to generate the signal GATEN for the NMOS transistor of the CMOS complementary pair of transistors incorporated in the buffer stage 2. Similarly, the portion 1B of FIG. 12 is intended to generate the signal GATEP for the PMOS transistor of the same complementary pair of the buffer stage 2.

Advantageously, thanks to the mode of generation of the signals GATEN and GATEP, the buffer stage 2 is active at high speed with respect to the approaches proposed by the known techniques. Moreover, reduced noise is induced on the power supply.

Advantageously, the driving circuit does not use resistors and it allows generating the control signals GATEN and GATEP for the output buffer stage 2 through CMOS structures only.

As it has been previously said, the need of obtaining low output impedances has, as a consequence, a high gate capacitance seen by the signals GATEN and GATEP. This peculiarity, together with the high switching speed required for multilevel memories, has led to the realization of a control of a buffer 2 by signals GATEN and GATEP with only MOS transistors and a low Rdson.

FIG. 11 shows the first circuit portion 1A for the generation of the control signals GATEN. As it can be appreciated, such portion comprises a complementary pair of output MOS transistors M1, M3 connected in series to each other between a first supply voltage reference VDDQ and a second voltage reference, for example, a signal ground GNDQ.

Such transistors M1 and M3 receive, in parallel on the respective gate terminals, a signal DRIVE_N coming from the output of a logic gate NR2P. The logic gate NR2P is of the NOR type and it receives, on a pair of inputs A, B, an input signal IN and an enable signal ENAB_N.

The output Z of the logic gate NR2P is branched off through a series of inverters IV forming a delay chain 3 having a signal output connected to the input of a second logic gate OR2. The other input of such logic gate OR2 directly receives the signal issued from the first logic gate NR2P.

The output of the second logic gate OR2 issues a signal DRIVE_PN_PULSE and it is connected to the gate terminal of a third MOS transistor, of the PMOS type and indicated with M2, whose conduction terminals are respectively connected to the first voltage reference VDDQ and to the interconnection node O between the transistors M1 and M3 of the output complementary pair.

The structure of the other circuit portion 1B intended for the generation of the signal GATEP is substantially similar with respect to the previous one and for it the same reference numbers will be used to refer to circuit components identical to those of the circuit portion 1A.

Also portion 1B comprises a complementary pair of output MOS transistors M1, M3 connected in series to each other between a first supply voltage reference VDDQ and a second voltage reference, for example a signal ground GNDQ.

Such transistors M1 and M3 receive, in parallel on the respective gate terminals, a signal DRIVE_P coming from the output of a logic gate ND2P. The logic gate ND2P is of the NAND type and it receives, on a pair of inputs A, B, an input signal IN and an enable signal ENAB_P. The output of the logic gate ND2P is branched off through a series of inverters IV forming a delay chain 3 having a signal output connected to the input of a second logic gate AN2. The other input of such logic gate AN2 directly receives the signal issued from the first logic gate ND2P. The output of the logic gate AN2 issues a signal DRIVE_NP_PULSE and it is connected to the gate terminal of a third MOS transistor, of the NMOS type and indicated with M5, whose conduction terminals are respectively connected to the interconnection node O between the transistors M1 and M3 of the output complementary pair and to the second voltage reference GNDQ.

The driving method is carried out by the generation of respective control signals GATEN and GATEP applied to the gate terminals of the transistors of the buffer stage 2 and having a linear pattern at intervals with only two slopes. In a first stage, the steepest slope is obtained by the transistors M1 and M2, this latter being enabled through the pulse DRIVE_PN_PULSE, for portion 1A and by the transistors M3 and M5, this latter being enabled through the pulse DRIVE_NP_PULSE, for portion 1B.

The width and the delay of the above pulses, with respect to the signals DRIVE_N and DRIVE_P, are obtained by the delay chain 3 formed by the inverters IV and by the logic gates, in one case of the NOR type and in the other of the NAND type with two inputs.

The circuit, intended as a whole, i.e. as if it were formed by the two portions 1A and 1B, each being connected at the output to the respective gate terminal of the buffer stage 2, ensures also that the pulse timely shows up after the signals DRIVE_N and DRIVE_P, avoiding in such way that excessive OVERLAP currents are generated.

Figure 14:
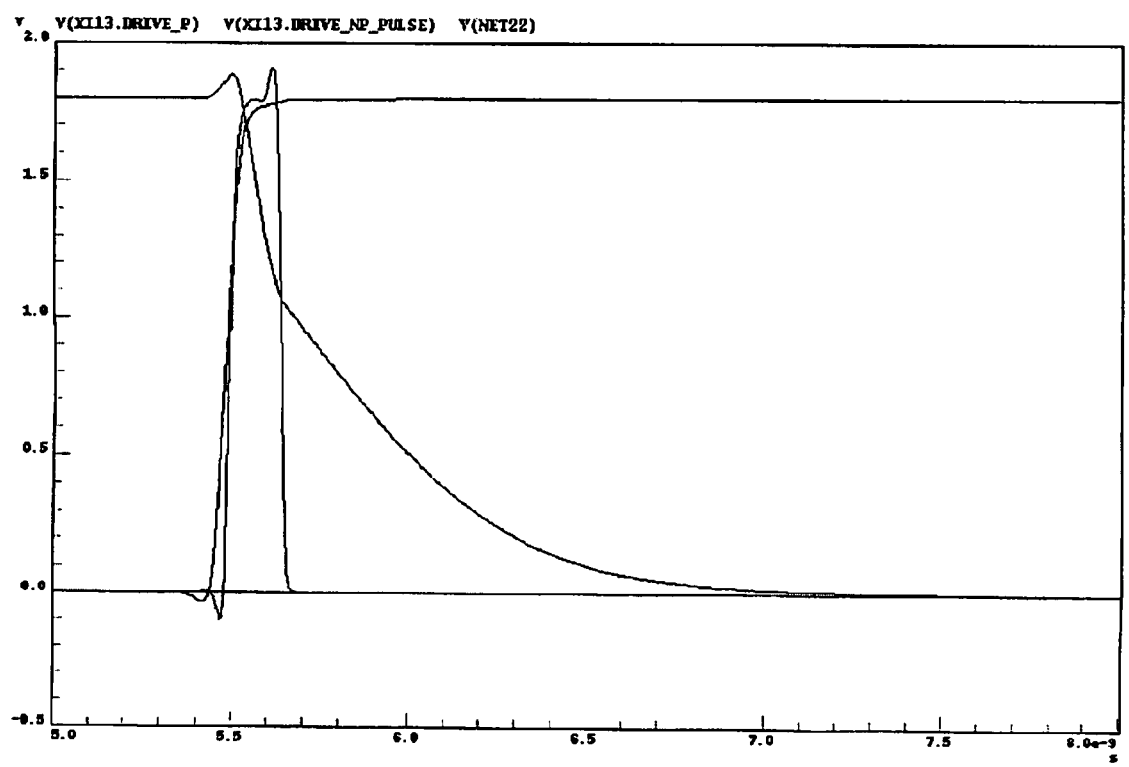
FIGS. 14 to 17 show respective diagrams of experimental and simulation results on the driving circuit according to the invention.
Figure 15:
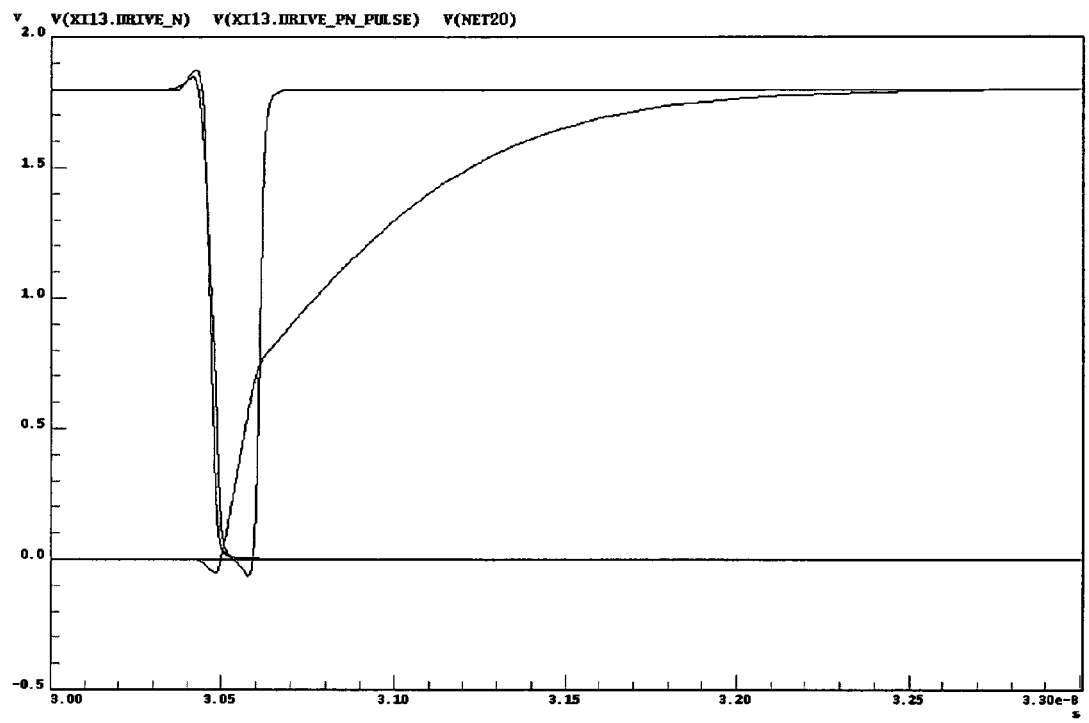

To better understand the operation of the buffer 2, once it is driven with the circuit according to the invention, the results of some simulations are shown. In particular, FIG. 14 shows a detail of the time window wherein the control with variable slope is realized. FIGS. 14 and 15 highlight the pulse signals DRIVE_NP_PULSE and DRIVE_PN_PULSE and the control signals DRIVE_P (NET22) and DRIVE_N (NET20). These latter diagrams highlight the double slope of the signal with a first phase corresponding to the width of the pulses.

Figure 13:
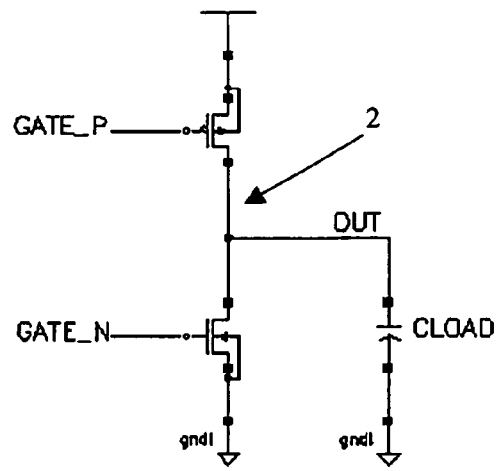
FIG. 13 shows a schematic view of a buffer stage driven by the circuit of FIGS. 11 and 12.
Figure 16:
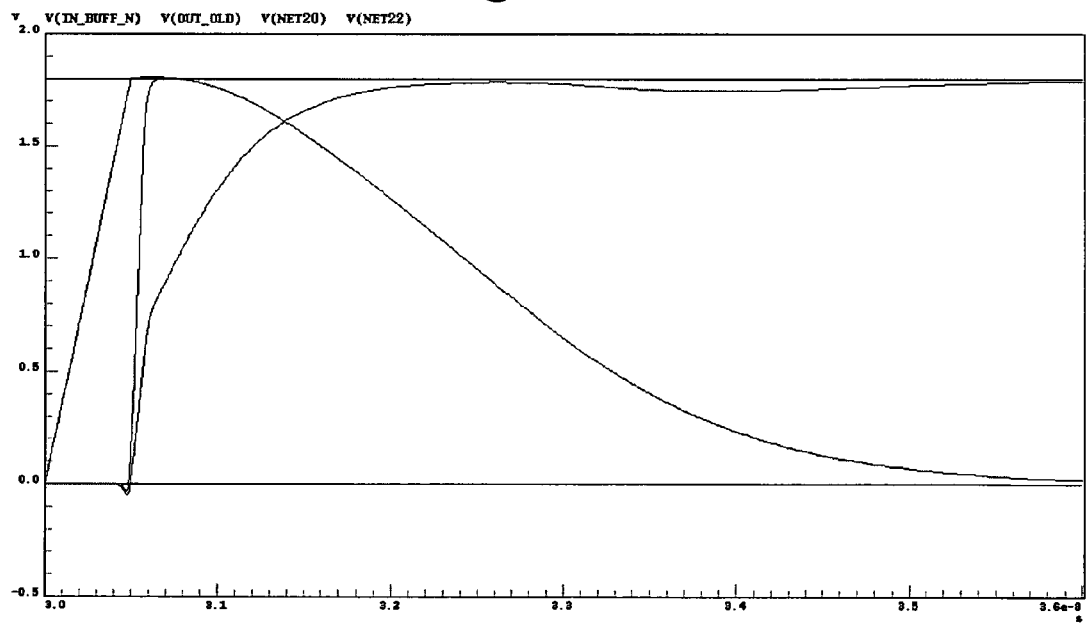
Figure 17:
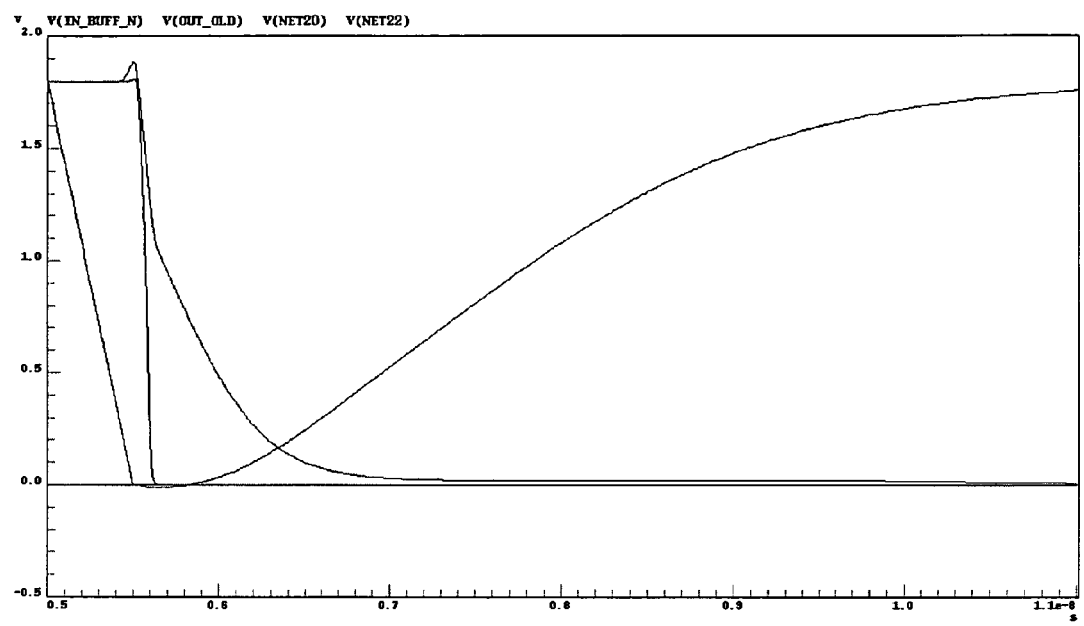

FIGS. 16 and 17, besides the controls with double slope, show the switch steps of the output in correspondence with the clock rising edge (IN_BUFF_N). The first step wherein the pulse intervenes is the step wherein the transistors of the buffer stage 2 of FIG. 13 have not yet entered into conduction.

In the output switching from the high value to the low value, in particular, the pulse intervenes when the NMOS transistor of the buffer stage 2 has not entered the conduction yet, this allowing acceleration of the output switching.

From the previous description it can be easily deduced how the driving circuit according to the invention addresses the problems and attains several advantages among which the following ones are to be particularly cited.

Although preserving the advantages of some of the prior art approaches, the circuit according to the invention may ensure the possibility of:

1. obtaining low output impedances;
2. minimizing the disturbances induced in the power supply; and
3. reducing the occupation in terms of layout of the buffer.

Moreover, with this approach the problem of the voltage amount generated by the resistors used in the circuits of the prior art is not present, and, thus, using a control signal with three slopes is no longer necessary.

That which is claimed is:

1. A driving circuit for an output buffer stage comprising a PMOS transistor and an NMOS transistor coupled together, the driving circuit comprising:

a first circuit portion for generating a driving signal for the NMOS transistor of the output buffer stage, and a second circuit portion for generating a driving signal for the PMOS transistor of the output buffer stage;

each of said first and second circuit portions comprising a complementary pair of MOS transistors coupled together and having respective conduction terminals directly coupled to supply voltage references, said complementary pair of MOS transistors defining an interconnection node therebetween, a logic network to generate an activation signal and comprising a delay chain including a plurality of identical logic gates coupled in series, and a third MOS transistor having conduction terminals coupled between one of the voltage references and the interconnection node, and a control terminal responsive to the activation signal, said third MOS transistor of said first circuit portion comprising a PMOS transistor, said third MOS transistor of said second circuit portion comprising an NMOS transistor.

2. The driving circuit according to claim 1, wherein said logic network further comprises an input logic gate coupled to said delay chain; and wherein said input logic gate receives an input signal and an enable signal.

3. The driving circuit according to claim 2, wherein said identical logic gates comprise a plurality of inverters coupled together in series.

4. The driving circuit according to claim 2, wherein said logic network further comprises a logic output gate coupled to said delay chain to deliver the activation signal to said third MOS transistor.

5. The driving circuit according to claim 2, wherein said input logic gate of said first circuit portion comprises a NOR logic input gate.

6. The driving circuit according to claim 2, wherein said input logic gate of said second circuit portion comprises a NAND logic input gate.

7. The driving circuit according to claim 4, wherein an output of said input logic gate is coupled to an input of said output logic gate.

8. The driving circuit according to claim 1, wherein the driving signal from each circuit portion is linear at intervals with at least one pair of slopes.

9. The driving circuit according to claim 2, wherein the activation signal is delivered to said third MOS transistor after a driving signal output from the input logic gate thereby avoiding generation of excessive overlap currents.

10. A memory device comprising:
at least one output buffer stage comprising a PMOS transistor and an NMOS transistor coupled together;
a first circuit portion for generating a driving signal for the NMOS transistor of said at least one output buffer stage, and a second circuit portion for generating a driving signal for the PMOS transistor of said at least one output buffer stage;
each of said first and second circuit portions comprising
a complementary pair of MOS transistors coupled together and having respective conduction terminals directly coupled to supply voltage references, said complementary pair of MOS transistors defining an interconnection node therebetween,
a logic network to generate an activation signal and comprising a delay chain including a plurality of identical logic gates coupled in series, and
a third MOS transistor having conduction terminals coupled between one of the voltage references and the interconnection node, and a control terminal responsive to the activation signal,
said third MOS transistor of said first circuit portion comprising a PMOS transistor,
said third MOS transistor of said second circuit portion comprising an NMOS transistor.

11. The memory device according to claim 10, wherein said logic network comprises an input logic gate coupled to said delay chain; and wherein said input logic gate receives an input signal and an enable signal.

12. The memory device according to claim 11, wherein said identical logic gates comprise a plurality of inverters coupled together in series.

13. The memory device according to claim 11, wherein said logic network further comprises a logic output gate coupled to said delay chain to deliver the activation signal to said third MOS transistor.

14. The memory device according to claim 11, wherein said input logic gate of said first circuit portion comprises a NOR logic input gate; and wherein said input logic gate of said second circuit portion comprises a NAND logic input gate.

15. The memory device according to claim 13, wherein an output of said input logic gate is coupled to an input of said output logic gate.

16. The memory device according to claim 10, wherein the driving signal from each circuit portion is linear at intervals with at least one pair of slopes.

17. A method of driving an output buffer stage comprising a PMOS transistor and an NMOS transistor coupled together, the method comprising:
generating a driving signal for the NMOS transistor of the output buffer stage using a first circuit portion;
generating a driving signal for the PMOS transistor of the output buffer stage using a second circuit portion;
each of the first and second circuit portions comprising
a complementary pair of MOS transistors coupled together and having respective conduction terminals directly coupled to supply voltage references, the complementary pair of MOS transistors defining an interconnection node therebetween,
a logic network to generate an activation signal and comprising a delay chain including a plurality of identical logic gates coupled in series, and
a third MOS transistor having conduction terminals coupled between one of the voltage references and the interconnection node, and a control terminal responsive to the activation signal, the third MOS transistor of the first circuit portion comprising a PMOS transistor and the third MOS transistor of the second circuit portion comprising an NMOS transistor.

18. The method according to claim 17, wherein the logic network further comprises an input logic gate coupled to the delay chain; and wherein the input logic gate receives an input signal and an enable signal.

19. The method according to claim 18, wherein the identical logic gates comprise a plurality of inverters coupled together in series.

20. The method according to claim 18, wherein the logic network further comprises a logic output gate coupled to the delay chain to deliver the activation signal to the third MOS transistor.

21. The method according to claim 18, wherein the input logic gate of the first circuit portion comprises a NOR logic input gate.

22. The method according to claim 18, wherein the input logic gate of the second circuit portion comprises a NAND logic input gate.

23. The method according to claim 20, wherein an output of the input logic gate is coupled to an input of the output logic gate.

24. The method according to claim 17, wherein the driving signal from each circuit portion is linear at intervals with at least one pair of slopes.

25. The method according to claim 18, wherein the activation signal is delivered to the third MOS transistor after a driving signal output from the input logic gate thereby avoiding generation of excessive overlap currents.

26. A driving circuit for an output buffer stage comprising a PMOS transistor and an NMOS transistor coupled together, the driving circuit comprising:
a first circuit portion for generating a driving signal for the NMOS transistor of the output buffer stage, and a second circuit portion for generating a driving signal for the PMOS transistor of the output buffer stage;
each of said first and second circuit portions comprising
a complementary pair of MOS transistors coupled between supply voltage references, said complementary pair of MOS transistors defining an interconnection node therebetween,
a logic network to generate an activation signal and comprising
a delay chain,
an input logic gate coupled thereto, and
a logic output gate coupled to said delay chain,
said input logic gate receiving an input signal and an enable signal, and
a third MOS transistor having conduction terminals coupled between one of the voltage references and the interconnection node, and a control terminal responsive to the activation signal, said logic output gate delivering the activation signal to said third MOS transistor,
said third MOS transistor of said first circuit portion comprising a PMOS transistor,
said third MOS transistor of said second circuit portion comprising an NMOS transistor.

27. The driving circuit according to claim 26, wherein said input logic gate of said first circuit portion comprises a NOR logic input gate.

28. The driving circuit according to claim 26, wherein said input logic gate of said second circuit portion comprises a NAND logic input gate.

29. A memory device comprising:
- at least one output buffet stage comprising a PMOS transistor and an NMOS transistor coupled together;
- a first circuit portion for generating a driving signal for the NMOS transistor of said at least one output buffer stage, and a second circuit portion for generating a driving signal for the PMOS transistor of said at least one output buffer stage;
- each of said first and second circuit portions comprising
- a complementary pair of MOS transistors coupled between supply voltage references, said complementary pair of MOS transistors defining an interconnection node therebetween,
- a logic network to generate an activation signal and comprising
  - a delay chain,
  - an input logic gate coupled thereto, and
  - a logic output gate coupled to said delay chain,
  - said input logic gate receiving an input signal and an enable signal, and
- a third MOS transistor having conduction terminals coupled between one of the voltage references and the interconnection node, and a control terminal responsive to the activation signal, said logic output gate delivering the activation signal to said third MOS transistor,
- said third MOS transistor of said first circuit portion comprising a PMOS transistor,
- said third MOS transistor of said second circuit portion comprising an NMOS transistor.

30. The memory device according to claim 29, wherein said delay chain comprises a plurality of inverters coupled together in series.

31. The memory device according to claim 29, wherein said input logic gate of said first circuit portion comprises a NOR logic input gate; and wherein said input logic gate of said second circuit portion comprises a NAND logic input gate.

32. A method of driving an output buffer stage comprising a PMOS transistor and an NMOS transistor coupled together, the method comprising:
- generating a driving signal for the NMOS transistor of the output buffer stage using a first circuit portion;
- generating a driving signal for the PMOS transistor of the output buffer stage using a second circuit portion;
- each of the first and second circuit portions comprising
- a complementary pair of MOS transistors coupled between supply voltage references, the complementary pair of MOS transistors defining an interconnection node the therebetween,
- a logic network to generate an activation signal and comprising
  - a delay chain,
  - an input logic gate coupled thereto, and
  - a logic output gate coupled to said delay chain,
  - said input logic gate receiving an input signal and an enable signal, and
- a third MOS transistor having conduction terminals coupled between one of the voltage references and the interconnection node, and a control terminal responsive to the activation signal, said logic output gate delivering the activation signal to said third MOS transistor, the third MOS transistor of the first circuit portion comprising a PMOS transistor and the third MOS transistor of the second circuit portion comprising an NMOS transistor.

33. The method according to claim 32, wherein the input logic gate of the first circuit portion comprises a NOR logic input gate.

34. The method according to claim 32, wherein the input logic gate of the second circuit portion comprises a NAND logic input gate.

* * * * *

UNITED STATES PATENT AND TRADEMARK OFFICE
CERTIFICATE OF CORRECTION

PATENT NO. : 7,408,377 B2
APPLICATION NO. : 11/256245
DATED : August 5, 2008
INVENTOR(S) : Giuseppe Castagna et al.

It is certified that error appears in the above-identified patent and that said Letters Patent is hereby corrected as shown below:

Column 10, Line 14      Delete: "the"

Signed and Sealed this

Eleventh Day of November, 2008

JON W. DUDAS
*Director of the United States Patent and Trademark Office*